United States Patent [19]

Ogawa et al.

[11] Patent Number: 4,994,350
[45] Date of Patent: Feb. 19, 1991

[54] METHOD FOR FORMING A COLOR PROOF HAVING A SPECIFIED TOE GRADATION

[75] Inventors: Takahiro Ogawa; Shun Takada, both of Odawara, Japan

[73] Assignee: Konica Corporation, Tokyo, Japan

[21] Appl. No.: 402,840

[22] Filed: Sep. 5, 1989

[30] Foreign Application Priority Data

Sep. 7, 1988 [JP] Japan ................. 63-224013

[51] Int. Cl.$^5$ ................. G03C 7/00; G03C 7/10
[52] U.S. Cl. ................. 430/358; 430/367; 430/264; 430/265; 430/949
[58] Field of Search ............... 430/358, 367, 264, 265, 430/949

[56] References Cited

U.S. PATENT DOCUMENTS

| | | | |
|---|---|---|---|
| 3,764,318 | 10/1973 | Lanidon et al. | 430/358 |
| 3,895,948 | 7/1975 | Shiba et al. | 430/588 |
| 4,686,167 | 8/1987 | Resnick et al. | 430/264 |
| 4,705,745 | 11/1987 | Kitchin et al. | 430/505 |
| 4,816,378 | 3/1989 | Powers et al. | 430/301 |
| 4,818,663 | 4/1989 | Powers et al. | 430/358 |
| 4,879,204 | 11/1989 | Ishigaki et al. | 430/512 |

*Primary Examiner*—Paul R. Michl
*Assistant Examiner*—Patrick A. Doody
*Attorney, Agent, or Firm*—Jordan B. Bierman

[57] ABSTRACT

An image forming method suitable for forming a color proof is disclosed. The method comprises (1) a step for exposing a silver halide color photographic light-sensitive material, which is comprised of a support having thereon photographic component layers including a yellow image-forming blue-sensitive, a magenta image forming green-sensitive and a cyan image-forming red-sensitive emulsion layer, to light through a transparent black-and-white halftone image and (2) a step for processing the exposed light-sensitive material to form a color image, wherein the photographic component layers contain a yellow water-soluble dye, a magenta water-soluble dye and a cyan water-soluble dyes and reflective densities of the sliver halide color photographic material measured with light of 450 nm, 550 nm and 700 nm are each not less than 0.8, and toe portion gradations of characteristic curves of yellow, magenta and cyan images formed in the light-sensitive material by the processing are each not less than 1.7, and the toe portion gradations of the yellow, magnet and cyan image have the following relation:

$$|1-\gamma_A'/\gamma_A| \leq 0.05$$

wherein $\gamma_A'$ is toe portion gradiation of one of the images, and $\gamma_A$ is that of another one of the images.

7 Claims, 1 Drawing Sheet

FIG. 1

METHOD FOR FORMING A COLOR PROOF HAVING A SPECIFIED TOE GRADATION

FIELD OF THE INVENTION

The present invention relates to a method for forming a color image, and more particularly to a method for forming a color image which is suitable for making a color proof through a transparent black-and-white color-separation halftone image prepared from a color original.

BACKGROUND OF THE INVENTION

In recent years, color light-sensitive materials have been diversified as seen in, for example, the color light-sensitive materials such as those for use in making color proofs. Light-sensitive materials to be used for these purposes are demanded to have characteristics comprising a high sharpness, being free of character blur, and high reproducibility of halftone dots and color balance for a color proof.

In the printing industry, the color proof is for a substitute process to curtail a trial printing step of the printing process of making prints from a color original. For the color proof, there are various known processes, including the silver halide photographic process, photopolymer transfer process, and toner transfer process.

In the photopolymer transfer process, the transfer process is not only so complicated that an image cannot be quickly obtained but also costly. In the toner transfer process, toner scattering occurs, so that it is not preferable from the environmental hygienic point of view. On the other hand, the silver halide photographic process is free of these shortcomings, less costly and well operable, so that a color proof can be rapidly finished up.

However, any of these commercially available color light-sensitive materials is inadequate in the reproducibility of halftone dots, so that a color proof having a correct color balance cannot be obtained. A high-sharpness color light-sensitive material having an antihalation layer containing colloidal silver is commercially available as well, but it has problems in that the whiteness of its background is deteriorated, its photographic gradation is softened, and so forth. Thus, there has been a demand for a color image forming method capable of giving a color proof having a high halftone reproducibility and color balance free of these problems.

As the method for improving the sharpness of a color light-sensitive material, there are known methods of:

(1) preventing irradiation by a water-soluble dye,
(2) providing an antihalation layer containing colloidal silver or colloidal manganese,
(3) raising the filling density of a white pigment in the polyolefin layer of a polyolefin-laminated reflection paper support,
(4) thinning photographic component layers comprising a hydrophilic colloid, and
(5) incorporating into photographic component layers a compound capable of releasing a development inhibitor at the time of developing.

The method (1) is utilized in those commercially available color light-sensitive materials for making color prints, but the water-soluble dye content of the material is so low that the reflection densities at wavelengths of 450 nm, 550 nm and 700 nm prior to developing the color light-sensitive material is lower than 0.5. Therefore, any color proof having an adequate sharpness and a correct color balance cannot be obtained.

The method (2) produces only an image inferior in the color balance as a color proof because the method deteriorates the white background of the image by a stain due to insufficient bleach-fix of colloidal silver as well as by a fog of silver halide of the light-sensitive material, and also heavily soften the photographic gradation. For this problem, Japanese Patent Publication Open to Public Inspection (hereinafter referred to as Japanese Patent O.P.I. Publication) No. 63034/1988 proposes a specific proportion of the gelatin and colloidal silver of the antihalation and adjacent auxiliary layers, and Japanese Patent O.P.I. Publication No. 63040/1988 proposes a specific thickness of the antihalation layer, but any of these proposals are still unable to provide satisfactory effects.

The method (3) is described in Japanese Patent O.P.I. publication Nos. 284763/1986, 270749/1986 and 270750/1986, but is unable to give any satisfactory image as a color proof.

The method (4) has its limits in thinning photographic component layers, thus being not so much effective as to improve sharpness.

And the method (5), although useful to emphasize the edge effect of an image having a low spatial frequency, is unable to produce any satisfactory image as a color proof.

In a color proof preparing method which uses a color light-sensitive material, various techniques for obtaining objective colors are disclosed.

For example, Japanese Patent O.P.I. Publication No. 141034/1978 describes preparation of a colored standard diagram and a method for determining an exposure time in accordance with the diagram. This method, however, although it enables the obtaining of objective yellow, magenta and cyan monochromatic densities, is unable to give any well color-balanced color proof comprising blue, green and red in the additive color process. Besides, the procedure for exposure in this method is complicated.

Japanese Patent O.P.I. publiCation No. 104335/1981 discloses a color proof making method which causes the overall photographic gradation of a light-sensitive material to be not less than 2.0. However, the publication makes no mention at all of the photographic gradations and the balance thereof at the toe of the characteristic curves of respective yellow, magenta and cyan color images. It describes examples of the color light-sensitive material including Fujicolor Paper 08, Fujichrome paper Type 31, Kodachrome 74RC. etc., but any of these are of a photographic toe gradation designed for making color paper prints from color films, and therefore not suitable for color proof making.

Japanese Patent O.P.I. Publication No. 1131139/1981 describes a method of making a color proof from a color light-sensitive material whose overall photographic gradation is not less than 2,0 and which, when exposed, contains other component colors. The method, however, is intended for correction of a discretional color, and is ineffectual in respect of the color balance.

Japanese Patent O.P.I. Publication No. 14651/1987 describes the use of a mask having dots in an exposure process. The method is to bring density changes to an image whose monochromatic densities are fixed, and has no relation with the color balance.

SUMMARY OF THE INVENTION

It is therefore an object of the present invention to provide a method for forming a color image which is capable of forming a color image provided with accurate halftone dot reproduction and color balance for color proof use. More particularly, the object of the invention is to provide a method of forming a color image which is capable of giving a color proof having an accurate color balance by making uniform the halftone dot qualities of the color proof's yellow image, magenta image and cyan image each having little fringe around the dot.

The above object of the invention is accomplished by an image forming method for making a color proof comprising a step for exposing a silver halide color photographic light-sensitive material, which is comprised of a support having thereon photographic component layers including an yellow image-forming blue-sensitive silver halide emulsion layer, a magenta image forming green-sensitive silver halide emulsion layer and a cyan image-forming red-sensitive silver halide emulsion layer, to light through a transparent black-and-white halftone image and a step for processing the exposed silver halide color photographic light-sensitive material to form a color image, wherein the photographic component layers contain a yellow water-soluble dye, a magenta water-soluble dye and a cyan water-soluble dye, and reflective densities of the silver halide color photographic material measured with light of 450 nm, 550 nm and 700 nm are each not less than 0.8 before the processing, and toe portion gradations of characteristic curve of yellow, magenta and cyan images formed in the silver halide color photographic light-sensitive material by the processing are each not less than 1.7, and the toe portion gradations of the yellow, magenta and cyan image have the following relation:

$$|1-\gamma_{A'}/\gamma_A| \leq 0.05$$

wherein $\gamma_{A'}$ is the toe portion gradation of one of the images, and $\gamma_A$ is that of another one of the images.

DETAILED DESCRIPTION OF THE INVENTION

The water-soluble yellow, magenta and cyan dyes to be contained in the photographic component layers of this invention include oxonol dyes, cyanine dyes, merocyanine dyes, azo dyes, anthraquinone dyes, allylidene dyes and the like. Those dyes which are particularly preferable because they are highly decomposable in a processing solution and do not color-sensitize any silver halide emulsion are oxonol dyes and merocyanine dyes.

Examples of the oxonol dye are described in U.S. Pat. No. 4,187,225, Japanese Patent O.P.I. Publication Nos. 42826/1973, 5125/1974, 99620/1974, 91627/1975, 77327/1976, 120660/1980, 24139/1983, 143342/1983, 38742/1984, 111640/1984, 111641/1984, 168438/1984, 218641/1985, 31916/1987, 66275/1987, 66276/1987, 1987, 185755/1987, 273527/1987 and 139949/1988. Examples of the merocyanine dye are described in Japanese patent O.P.I. Publication Nos. 145124/1975, 120245/1983, 35437/1988, 35438/1963, 34539/1988 and 58437/1988.

The following are typical examples of the oxonol and merocyanine dyes, but are not limited thereto:

Water-soluble yellow dyes:

AIY-1

AIY-2

-continued

AIY-3

AIY-4

AIY-5

AIY-6

AIY-7

AIY-8

-continued

AIY-9

AIY-10

AIY-11

AIY-12

AIY-13

AIY-14

Water-soluble magenta dyes:

AIM-1

AIM-2

AIM-3

AIM-4

AIM-5

AIM-6

AIM-7

AIM-8

AIM-9

AIM-10

AIM-11

AIM-12

AIM-13

AIM-14

Water-soluble cyan dyes:

AIC-1

AIC-2

AIC-3

AIC-4

AIC-5

AIC-6

AIC-7

AIC-8

AIC-9

AIC-10

AIC-11

AIC-12

AIC-13

AIC-14

The following are typical examples of those water-soluble dyes other than the oxonol dyes and merocyanine dyes, but the invention is not limited to the examples.

AIY-15

AIY-16

-continued

AIY-17

AIY-18

AIM-15

AIM-16

AIM-17

AIM-18

AIC-15

AIC-16

AIC-17

AIC-18

Any of the water-soluble dyes of the invention are added in an amount that causes the reflection densities at wavelengths of 450 nm, 550 nm and 700 nm of the color light-sensitive material prior to its development to be not less than 0.8.

The total adding amount of the water-soluble dyes depends on the kind and structure of the dye to be used, and cannot be determined unconditionally, but is preferably in the range of approximately 0.03 to 0.6 g/m². The respective adding amounts of the water-soluble yellow, magenta and cyan dyes cannot be determined unconditionally, either, but if used in the range of approximately 0.01 to 0.2 g/m², then satisfactory results may be obtained.

Each reflection density measured at 450 nm, 550 nm and 700 nm is preferably in the range of 0.9 to 1.2. The reflection density in this invention is a value measured by means of a Color Analyzer 607, manufactured by Hitachi, Ltd.

The water-soluble dyes of the invention are incorporated into the light-sensitive silver halide emulsion layers and/or non-light-sensitive layers, and are a combination of water-soluble yellow, magenta and cyan dyes. Each of the water-soluble yellow, magenta and cyan dyes can be used alone or in combination with two or more kinds.

Figure 1:
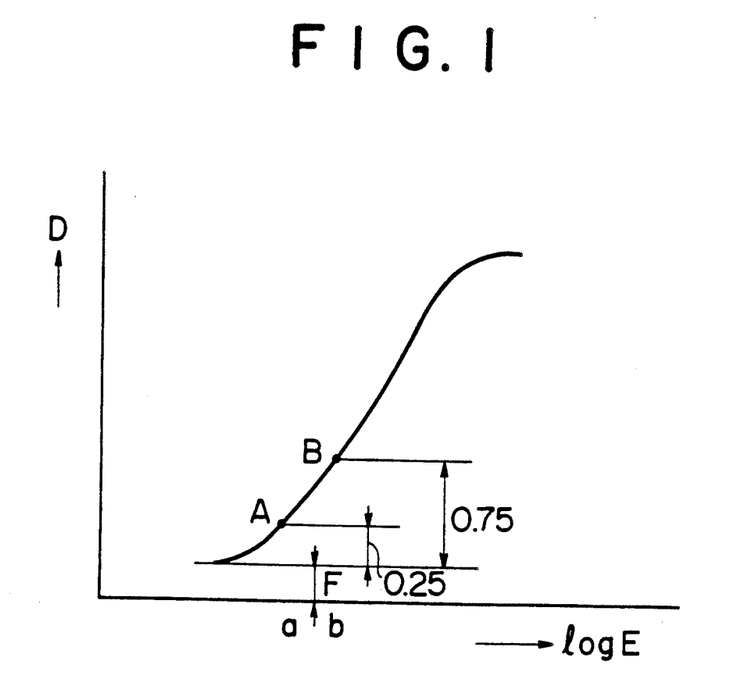
FIG. 1 is a drawing for explaining a method for finding the photographic gradation in the toe portion of the characteristic curve of a photographic light-sensitive material, wherein D axis is for reflection densities, log E axis is for exposure expressed in logarithms, F represents a fog value. A is a point on the characteristic curve when D takes a value of F+0.25, and a represents the log E value in this instance. Similarly, B is a point when D takes a value of F+0.75, and b is the log E value in this instance.

The 'photographic toe gradation' in this invention is defined as a gradient of the line that is obtained when connecting the point A of Figure at which a characteristic curve intersects the fog+0.25 level with the point B of FIG. 1 at which the curve intersects the fog+0.75 level.

That is, photographic toe gradation = $\dfrac{0.5}{|b-a|}$

The photographic toe gradation may be adjusted by controlling the chemical ripening conditions of a silver halide emulsion, e.g., an amount of sodium thiosulfate, ripening temperature, ripening time; the distribution width of silver halide grains, e.g., monodisperse emulsion, polydisperse emulsion; additives, e.g., antistain agent, couplers, and also by controlling the developing condition, but is preferably adjusted when preparing the silver halide emulsion.

It has been found that there is a strong correlation between the fringe of dot and the photographic toe gradation, and when the photographic toe gradation is 1.7 or more, the fringe of dot is lessened. A particularly preferred photographic toe gradation is 2.0 or more. For stabilization of the exposure latitude, the photographic gradation at the point of a density of 1.7 is preferably 1.8 to 2.5. It has also been found that when the degree of fringe of the dot is made uniform in the yellow, magenta and cyan images, a color proof having well balanced color is obtained. That is, it means that the photographic toe gradations of the yellow, magenta and cyan images become close to one another, and particularly the balance of the photographic toe gradations is as effective as within ±5%.

The 'balance of the photographic toe gradations is within ±5%' herein is expressed as $$\left| 1 - \dfrac{\gamma_{A'}}{\gamma_A} \right| \leq 0.05$$

wherein $\gamma_A$ represents the photographic toe gradation of an arbitrary silver halide emulsion layer, and $\gamma_{A'}$ represents the photographic toe gradation of one of the other silver halide emulsion layers.

The photographic toe gradation balance can be restrained within ±5% by adjusting in the foregoing manner the respective photographic toe gradations of the yellow, magenta and cyan images.

The silver halide emulsion used in the invention may contain an arbitrary silver halide such as silver bromide, silver iodobromide, silver iodochlorobromide, silver chlorobromide, silver chloroiodobromide, silver chloride or the like.

As a method of forming silver halide grains, any of the acidic method, neutral method and ammoniacal method may be used, and methods known to those in the art, such as the simultaneously mixing method, orderly mixing method, inversely mixing method, conversion method or the like, may also be used.

The silver halide grain may be either in the regular crystal form such as a cubic, octahedral or tetradecahedral crystal, or in the irregular crystal form such as a spheric or tabular crystal. Also, the grain may be in the complex form or of a mixture of various crystal forms.

The silver halide emulsion used for this invention may be either of a wide grain size distribution (polydisperse emulsion) or of a narrow grain size distribution (monodisperse emulsion), and preferably a monodisperse emulsion having a coefficient of variation of not more than 0.20, which is defined by the standard deviation/average grain size. The grain size is preferably 0.1 to 1.0 μm.

The silver halide emulsion may be subjected in usual manner to chemical sensitization such as sulfur sensitization, gold sensitization, selenium sensitization or reduction sensitization, and also to spectral sensitization by the use of sensitizing dyes such as a cyanine dye, merocyanine dye, hemicyanine dye, styryl dye or hemioxonol dye.

For the light-sensitive material having a photographic toe gradation of not less than 1.7 used in the method of the invention, as has been mentioned above, 'a monodisperse emulsion whose silver halide grain sizes' coefficient of variation is not more than 0.20 is particularly suitably used. The silver halide emulsion is obtained preferably by a method wherein the adding speed of a water-soluble halide solution and a water-soluble silver salt solution is controlled according to the growth of the silver halide grain, the so-called functional addition double-jet mixing method. The formation of the silver halide grain is made at a temperature of preferably 50° C. to 70° C. In this instance, a silver halide solvent such as ammonia or thiourea may be used. The obtained monodisperse emulsion is chemically ripened preferably with use of sodium thiosulfate in an amount of 1 to 10 mg per mol of silver. The ripening is made at a temperature of preferably 50° C. to 70° C. A gold salt or a thiocyanate may be used in combination in an amount of 0.1 to 1 mg per mol of silver.

To the emulsion may be added any of those antifoggants or stabilizers known to those skilled in the art, such as azaindenes, or mercapto heterocyclic compounds.

In an emulsion layer of the light-sensitive material is used a non-diffusible coupler which, in a color developing process, is capable of forming a dye by its coupling reaction with the oxidation product of an aromatic primary amine compound such as p-phenylenediamine derivative or an aminophenol derivative.

As a yellow dye forming coupler, any of acylacetanilide-type couplers may be used. Among these, benzoylacetanilide-type and pivaloylacetanilide-type compounds are suitably used. Examples of the yellow dye forming coupler are described in U.S. Pat. Nos. 2,875,057, 3,265,506, 3,408,194, 3,551,155, 3,891,445, Japanese Patent O.P.I. Publication Nos.73147/1973, 6341/1975, 21827/1977, 115219/1977 and 95346/1983.

As a magenta dye forming coupler, any of 5-pyrazolone-type, pyrazoloazole-type, pyrazolinobenzimidazole-type, indazol-one-type, and open-chain acylacetanilide-type couplers may be used, which are described in U.S. Pat. Nos. 2,600,788, 3,062,653, 3,152,896, 3,558,318, 3,930,866, Japanese Patent O.P.I. Publication Nos. 29639/1974 and 13041/1975.

As a cyan dye forming coupler, a phenol or naphthol-type coupler is generally used. Examples of the cyan coupler are described in U.S. Pat. Nos. 2,369,992, 2,434,272, 2,698,974, 3,034,892, 3,839,044, Japanese Patent O.P.I. Publication Nos. 3742/1972, 112038/1975 and 130441/1975.

To the light-sensitive material may be added a benzophenon-type or benzotriazole-type ultraviolet absorbing agent. Particularly, the benzotriazole-type compound is preferable, examples of which are described in U.S. Pat. Nos. 3,754,919, 4,220,711, Japanese Patent O.P.I. Publication Nos. 26187/1967, 5496/1973 and 41572/1973.

In obtaining the light-sensitive material having a photographic toe gradation of not less than 1.7 used in the method of the invention, it is preferable to incorporate dialkylhydroquinone, an antistain agent, in an amount of 0.05 mol/mol of coupler into a cOupler oil.

The hydrophobic compound such as the above-mentioned dye forming coupler and ultraviolet absorbing agent is usually dissolved in a high-boiling solvent such as a phthalate, phosphate, phenol derivative, alkylamide or cycloalkane, or, if necessary, in combination with a low-boiling and/or water-soluble organic solvent, and the solution is then emulsifiedly dispersed with use of a surface active agent into a binder.

Examples of a meterial to be used as the binder for the photographic component layers of the invention include gelatin, albumin, agar-agar, gum arabic, partially hydrolyzed polyvinyl acetate, polyacrylamide and the like; particularly. gelatin is suitable.

The emulsion layers and auxiliary layers provided on the emulsion-coated side of the support may contain various photographic additives such as, e.g., the dye image stabilizer, antistain agent, brightening agent, antistatic agent, hardener, surfactant, plasticizer, wetting agent and the like described in Reseach Disclosure 17643.

A useful method of coating the emulsion layers and other component layers is a slide-hopper coating method, curtain coating method or air-doctor coating method; particularly, simultaneous multilayer coating by the slide-hopper method is suitable.

The reflection support of this invention includes a paper base both sides of which are laminated with a thermoplastic resin such as a polyolefin, e.g., polyethylene or polypropylene, containing a white pigment (so-called RC paper), a baryta paper, and a plastic film containing a white pigment. Particularly, an RC paper with a thickness of 100 to 150 μm is preferable for the reason that it has as a smooth feel as an art paper.

In the method of the invention, the process for forming halftone images to be printed on a light-sensitive material and the exposure conditions for the printing of the light-sensitive material are not particularly restricted. In a conventional embodiment, the light-sensitive material is superposedly imagewise exposed through transparent halftone images, which are to be printed with yellow, magenta and cyan printing inks to form a multicolor image on printed matter, to blue, green and red lights, respectively, and the exposed light-sensitive material is then subjected to color developing to form an image comprised of yellow, magenta and cyan half-tone image elements to thereby obtain an objective color proof. In this instance, it is discretional to additionally expose the light-sensitive material through a halftone image, which is to be printed with a black ink, to a chromatic light therefor.

An exposure to be used in the invention is carried out in the manner of contact printing exposure, photographing exposure, enlarging exposure, and scanning exposure; particularly, the procedure of contact printing exposure is suitable in respect of the color proof's dot reproducibility and the dimensional reproducibility to an original.

A light source to be used for the exposure of this invention includes a natural light, tungsten lamp, fluorescent lamp, mercury vapor lamp, halogen lamp and the like; particularly, the fluorescent lamp is preferable because it not only emits less heat but makes feasible a compact-type exposure device.

The color processing in this invention is usually carried out in the order of the color developing process, bleach-fix process and washing or stabilization process which are known to those skilled in the art. In a direct positive color light-sensitive material, a reversal processing such as a fogging treatment is also used in addition to the above. In a reversal color light-sensitive material, a positive image can be obtained by combining the above processes with a first black-and-white developing process.

A color developing agent typically used for processing the color light-sensitive material of the invention is an aromatic primary amine. A color developer solution to be used for the processing may contain a known alkali agent, preservative, antifoggant, brightening agent, and the like. A bleach-fix bath may contain a known bleaching agent and a fixing agent.

EXAMPLES

The present invention is illustrated in detail by the following examples, but the invention is not limited thereto.

EXAMPLE 1

On a 135μm-thick RC paper as a reflection support were coated the following photographic component layers to prepare a color light-sensitive material for making color proofs.

The added amount of each component below is a coating weight per m² of the light-sensitive material unless otherwise stated.

Photographic component layers

| Layer 1: Blue-sensitive silver halide emulsion layer | |
|---|---|
| Silver chlorobromide emulsion spectrally sensitized by sensitizing dye D-1, in silver equivalent | 0.34 g |
| Yellow coupler Y-1 | 0.9 g |
| High-boiling solvent HBS-1 | 0.9 g |
| Gelatin | 1.6 g |
| Layer 2: First intermediate layer | |
| 2,5-di-t-octylhydroquinone | 0.05 g |
| Diisodecyl phthalate | 0.15 g |
| Gelatin | 1.2 g |
| Layer 3: Green-sensitive silver halide emulsion layer | |
| Silver chlorobromide emulsion spectrally sensitized by sensitizing dye D-2, in silver equivalent | 0.40 g |
| Magenta coupler M-1 | 0.38 g |
| High-boiling solvent HBS-1 | 0.4 g |
| Gelatin | 1.4 g |
| Layer 4: Second intermediate layer | |
| Ultraviolet absorbing agent UV-1 | 0.3 g |
| 2,5-di-t-octylhydroquinone | 0.05 g |
| Dinonyl phthalate | 0.2 g |
| Gelatin | 1.4 g |
| Layer 5: Red-sensitive silver halide emulsion layer | |
| Silver chlorobromide emulsion spectrally sensitized by sensitizing dye D-3, in silver equivalent | 0.21 g |
| Cyan coupler C-1 | 0.47 g |
| High-boiling solvent HBS-2 | 0.24 g |
| Gelatin | 1.4 g |
| Layer 6: First protective layer | |
| Ultraviolet absorbing agent UV-1 | 0.7 g |
| Dinonyl phthalate | 0.4 g |
| Gelatin | 1.2 g |
| Layer 7: Second protective layer | |
| Silicon dioxide, average particle size 3 μm | 0.038 g |
| Gelatin | 1.0 g |

In addition, surfactants S-1 and S-2 as coating aids and hardeners H-1 and H-2 were used.

The silver halide emulsions that were subjected to the above respective spectral sensitizations are monodisperse emulsions having a coefficient of variation of 0.19. When the emulsions were subjected to chemical ripening, the amount of sodium thiosulfate, ripening temperature and ripening time were varied to thereby obtain the samples having photographic toe gradations as shown in Table 1.

To the above-mentioned photographic component layers were added water-soluble dyes as shown in Table 1.

D-1

-continued

D-2

D-3

Y-1

M-1

C-1

O=P($C_8H_{17}$)$_3$   HBS-1

HBS-2

UV-1

S-1

S-2

C(CH₂SO₂CH=CH₂)₄  H-2

TABLE 1

| Sample No. | Water-soluble dye (g/m²) | Reflection density*² before processing | | | Photographic toe gradation | | |
|---|---|---|---|---|---|---|---|
| | | 450 nm | 550 nm | 700 nm | Y | M | C |
| 1 (comp.) | AIY-13(0.027), AIM-3(0.006) and AIC-2(0.039) | 0.61 | 0.59 | 0.60 | 1.54 | 1.52 | 1.55 |
| 2 (comp.) | The same as sample No. 1 | 0.61 | 0.59 | 0.60 | 1.75 | 1.73 | 1.72 |
| 3 (comp.) | AIY-13(0.045), AIM-15(0.010) and AIC-2(0.065) | 1.02 | 1.06 | 1.05 | 1.54 | 1.52 | 1.55 |
| 4 (comp.) | The same as sample No. 3 | 1.02 | 1.06 | 1.05 | 1.75 | 1.73 | 2.00 |
| 5 (inv.) | The same as sample No. 3 | 1.02 | 1.06 | 1.05 | 1.75 | 1.73 | 1.72 |
| 6 (inv.) | The same as sample No. 3 | 1.02 | 1.06 | 1.05 | 2.21 | 2.22 | 2.18 |
| 7 (inv.) | AIY-13(0.045), AIM-3(0.010) and AIC-2(0.100) | 1.05 | 1.09 | 1.51 | 2.21 | 2.22 | 2.18 |
| 8 (inv.) | AIY-13(0.050), AIM-15(0.010) and AIC-15(0.130) | 1.03 | 1.01 | 1.04 | 2.21 | 2.22 | 2.18 |
| 9 (comp.) | No water-soluble dye added. An antihalation layer provided.*¹ | 1.04 | 1.01 | 1.01 | 1.30*³ | 1.73 | 1.72 |

*¹It contains 0.12 g/m² of black colloidal silver through a gelatin layer.
*²Measured by Color Analyzer Type 607, manufactured by Hitachi, Ltd.
*³The same blue-sensitive emulsion as sample No. 5 was used, but the gradation was softened.

The obtained samples No.1 to No.9 were processed as follows:

Exposure

Each color light-sensitive material sample was exposed in the manner of vacuum contact printing with a transparent black-and-white halftone image having 175 dots per inch with its dot area proportion varied.

A fluorescent lamp light was used as a light source, and Kodak Wratten gelatin filters No.47B, No.61 and No.29, respectively, were used as color separation blue, green and red filters.

| Processing steps | | |
|---|---|---|
| Color developing | 2 minutes | at 38° C. |
| Bleach-fix | 45 seconds | at 33° C. |
| Stabilizing | 1 minute and 30 seconds | at 33° C. |
| Drying | 1 minute | at 70° C. |

Color developer solution
N-ethyl-N-β-hydroxyethyl-4-aminoaniline sulfate  5.5 g
Hydroxylamine sulfate  2.0 g
Potassium carbonate  25.0 g
Sodium chloride  0.1 g
Sodium bromide  0.2 g
Anhydrous sodium sulfite  2.0 g
Benzyl alcohol  10.0 ml
Water to make 1 liter. Adjust the pH to 10.15 with sodium hydroxide.

Bleach-fix bath
Iron(III)-sodium ethylenediaminetetraacetate  60.0 g
Ammonium thiosulfate  100.0 g
Sodium bisulfite  20.0 g
Water to make 1 liter. Adjust the pH to 7.0 with sulfuric acid.

Stabilizer bath
5-Chloro-2-methyl-4-isothiazolin-3-one  1.0 g
Ethylene glycol  1.0 g
1-Hydroxyethylidene-1,1-diphosphonic acid  2.0 g
Ethylenediaminetetraacetic acid  1.0 g
Ammonium hydroxide (20% solution)  3.0 g
Ammonium sulfite  3.0 g
Brightening agent 4,4'-diaminostilbene-disulfonic acid derivative  1.5 g
Water to make 1 liter. Adjust the pH to 7.0 with sulfuric acid or potassium hydroxide.

Each processed sample was evaluated as follows:

Evaluation items (1) The white background density of each processed sample was measured.
(2) The halftone image quality as of a color proof was evaluated as follows:
A.. Having correct halftone reproducibility and color balance for quality prints (such as quality gravure prints for display use).
B.. Having correct halftone reproducibility and color balance for medium-quality prints (such as magazines, leaflets).
C.. Inferior in the color balance for prints.
D.. Large dot areas and small dot areas are defaced to be unacceptable for prints.

The results are shown in Table 2.

TABLE 2

| Sample No. | White background density | | | Halftone image quality |
|---|---|---|---|---|
| | Y | M | C | |
| 1 (comp.) | 0.04 | 0.04 | 0.03 | D |
| 2 (comp.) | 0.04 | 0.04 | 0.03 | D |
| 3 (comp.) | 0.04 | 0.04 | 0.03 | D |
| 4 (comp.) | 0.04 | 0.04 | 0.03 | C |
| 5 (inv.) | 0.04 | 0.04 | 0.03 | B |
| 6 (inv.) | 0.04 | 0.04 | 0.03 | A |
| 7 (inv.) | 0.04 | 0.04 | 0.03 | B |
| 8 (inv.) | 0.05 | 0.05 | 0.04 | B |
| 9 (comp.) | 0.08 | 0.07 | 0.04 | C |

As for the sample No.8, since it contains azo and anthraquinone dyes which are hardly decomposable in the developer solution, its white background was deteriorated to some extent.

In the sample No.9, the yellow image's photographic toe gradation was badly lowered being affected by the black colloidal silver, and the color balance was deteriorated. In addition, the black colloidal silver remained unbleached, thus showing a deteriorated white background.

EXAMPLE 2

Tests were carried out in the same manner as in Example 1 except that the sample No.6 of Example 1 was imagewise exposed in photographing manner. The results were slightly worse than Example 1, but satisfactory enough for a color proof.

EXAMPLE 3

A direct positive silver halide emulsion capable of forming an internal latent image speck by an exposure and a direct positive image by a fogging treatment was used to make tests in the same manner as in Example 1. The processing steps in the test are as follows:

| Processing steps | |
| --- | --- |
| Immersion in a color developer | 15 seconds at 38° C. |
| Light-fogging treatment | 10 seconds at 1 lux |
| Color developing | 2 minutes at 38° C. |
| Bleach-fix | 45 seconds at 33° C. |
| Stabilizing | 1 minute and 30 seconds at 33° C. |
| Drying | 1 minute at 70° C. |

The obtained results were similar to those of Example 1. In the running processing fluctuation, where water-soluble dyes which are easily decomposable in the developer solution were used, the sensitivity fluctuation due to the light-fogging treatment was small.

EXAMPLE 4

The samples which were prepared in Examples 1 and 2 were processed in the following processing solutions in accordance with the following steps to perform similar tests. As a result, the effect of this invention was obtained.

| Processing steps | Temperature | Time |
| --- | --- | --- |
| Color developing | 35.0 ± 0.3° C. | 45 seconds |
| Bleach-fix | 35.0 ± 0.5° C. | 45 seconds |
| Stabilizing | 30 to 34° C. | 90 seconds |
| Drying | 60 to 80° C. | 60 seconds |

| Color developer solution | |
| --- | --- |
| Pure water | 800 ml |
| Triethanolamine | 10 g |
| N,N-diethylhydroxylamine | 5 g |
| Potassium bromide | 0.02 g |
| Potassium chloride | 2 g |
| Potassium sulfite | 0.3 g |
| 1-Hydroxyethylidene-1,1-diphosphonic acid | 1.0 g |
| Ethylenediaminetetraacetic acid | 1.0 g |
| Disodium catechol-3,5-disulfonate | 1.0 g |
| N-ethyl-N-β-methanesulfonamidoethyl-3-methyl-4-aminoaniline sulfate | 4.5 g |
| Brightening agent 4,4'-diaminostilbene-disulfonic acid derivative | 1.0 g |
| Potassium carbonate | 27 g |
| Water to make 1 liter. Adjust the pH to 10.10. | |
| Bleach-fix bath | |
| Ferric-ammonium ethylenediaminetetraacetate | 60 g |
| Ethylenediaminetetraacetic acid | 3 g |
| Ammonium thiosulfate (70% solution) | 100 ml |
| Ammonium sulfite (40% solution) | 27.5 ml |
| Water to make 1 liter. Adjust the pH to 5.7 with potassium carbonate or glacial acetic acid. | |
| Stabilizer bath | |
| 5-Chloro-2-methyl-4-isothiazolin-3-one | 1.0 g |
| Ethylene glycol | 1.0 g |
| 1-Hydroxyethylidene-1,1-diphosphonic acid | 2.0 g |
| Ethylenediaminetetraacetic acid | 1.0 g |
| Ammonium hydroxide (20% solution) | 3.0 g |
| Ammonium sulfite | 3.0 g |
| Brightening agent 4,4'-diaminostilbene-diphosphonic acid derivative | 1.5 g |
| Water to make 1 liter. Adjust the pH to 7.0 with sulfuric acid or potassium hydroxide. | |

What is claimed is:

1. An image forming method for making a color proof comprising
    a step for exposing a silver halide color photographic light-sensitive material, comprising a support having thereon photographic component layers including a yellow image-forming blue-sensitive silver halide emulsion layer, a magenta image forming green-sensitive silver halide emulsion layer and a cyan image-forming red-sensitive silver halide emulsion layer, to light through a transparent black-and-white halftone image and
    a step for processing said exposed silver halide color photographic light-sensitive material to form a color image,
    wherein said photographic component layers contain a yellow water-soluble dye, a magenta water-soluble dye and a cyan water soluble dyes and reflective densities of said silver halide color photographic material measured with light of 450 nm, 550 nm and 700 nm are each not less than 0.8 before the processing, and
    toe portion gradations of characteristic curves of yellow, magenta and cyan images formed in said silver halide color photographic light-sensitive material by said processing are each not less than 1.7, and said toe portion gradations of said yellow, magenta and cyan image have the following relation:

$$|1 - \gamma_A'/\gamma_A| \leq 0.05$$

wherein $\gamma_a'$ is toe portion gradation of one of the three images, and $\gamma_A$ is toe portion gradation of another one of said three images.

2. The method of claim 1, wherein said toe portion gradations of said yellow, magenta and cyan images are each no less than 2.0

3. The method of claim 1, wherein gradations of the characteristic curves of said yellow, magenta and cyan image at the point of reflective density of 1.7 are each within the range of from 1.8 to 2.5.

4. The method of claim 1, wherein said reflective densities of said silver halide photographic light sensitive material measured with light of 450 nm, 550 nm and 700 nm are each within the range of from 0.9 to 1.2.

5. The method of claim 1, wherein said silver halide color photographic materials contains said yellow water soluble dye, magenta water-soluble dye and cyan water-soluble dye in an amount of from 0.03 g/m² to 0.6 g/m² in total.

6. The method of claim 1, wherein said silver halide color photographic materials contains said yellow water-soluble dye, magenta water soluble dye and cyan water-soluble dye each in an amount of from 0.01 g/m² to 0.2 g/m².

7. The method of claim 1, wherein said yellow water-soluble dye, magenta water-soluble dye and cyan water-soluble dye are each selected from oxonol dyes and merocyanine dyes.

* * * * *